(12) United States Patent
Zoorob

(10) Patent No.: US 6,775,448 B2
(45) Date of Patent: Aug. 10, 2004

(54) OPTICAL DEVICE

(75) Inventor: Majd E. Zoorob, Southampton (GB)

(73) Assignee: Mesophotonics Limited, Southampton (GB)

( * ) Notice: Subject to any disclaimer, the term of this patent is extended or adjusted under 35 U.S.C. 154(b) by 74 days.

(21) Appl. No.: 10/287,792

(22) Filed: Nov. 5, 2002

(65) Prior Publication Data

US 2004/0086249 A1 May 6, 2004

(51) Int. Cl.[7] .................................................. G02B 6/10
(52) U.S. Cl. ........................ 385/122; 385/129; 385/147
(58) Field of Search ......................... 385/122, 129–132, 385/147

(56) References Cited

U.S. PATENT DOCUMENTS 6,640,034 B1 * 10/2003 Charlton et al. ............ 385/122

FOREIGN PATENT DOCUMENTS

WO    WO 01/77726    10/2001

OTHER PUBLICATIONS

S. Cheng et al, "Defect and Transmission Properties of Two–Dimensional Quasiperiodic Photonic Band–Gap Systems" *Physical Review B*, vol. 59, No. 6, Feb. 1999, pp. 4091–4099.

Z. Ouyang et al, "Photonic Bandgaps in Two–Dimensional Short–Range Periodic Structures" *Journal of Optics A: Pure and Applied Optics*, vol. 4, No. 1, 2002, pp. 23–28.

M. Bayinder et al, "Photonic Band Gab Effect and Localization on Two–Dimensional Penrose Lattice" Quantum Electronics and Laser Science Conference (QELS 2001), May 2001, pp. 122, 123.

M. Bertolotti et al, "Transmission Properties of a Cantor Corrugated Waveguide" *Journal of the Optical Society of America*, vol. 13, No. 3, Mar. 1996, pp. 628–634.

C. Raid, "Symmetry and Tilings" *Notices of the American Mathematical Society*, vol. 42, No. 1, Jan. 1995, p. 26–31.

D. Mack, "The Magical Fibonacci Number" *IEEE Potentials*, vol. 9, No. 3, Oct. 1990, pp. 34, 35.

* cited by examiner

Primary Examiner—Akm Enayet Ullah
Assistant Examiner—Jerry T Rahll
(74) Attorney, Agent, or Firm—Nixon & Vanderhye P.C.

(57) ABSTRACT

In the present invention, an optical device having a waveguide structure includes a photonic band structure region, the photonic band structure region comprising a first region having a first refractive index and an array of subregions having a second refractive index, the array of subregions being arranged in a Fibonacci spiral pattern. The present invention can also be applied to optical fibers.

The Fibonacci spiral pattern and can be found in nature in the arrangement of the seeds of a sunflower and in pine kernels. The Fibonacci pattern is an optimal packing system for the sub-regions surrounding a central cavity region.

32 Claims, 8 Drawing Sheets

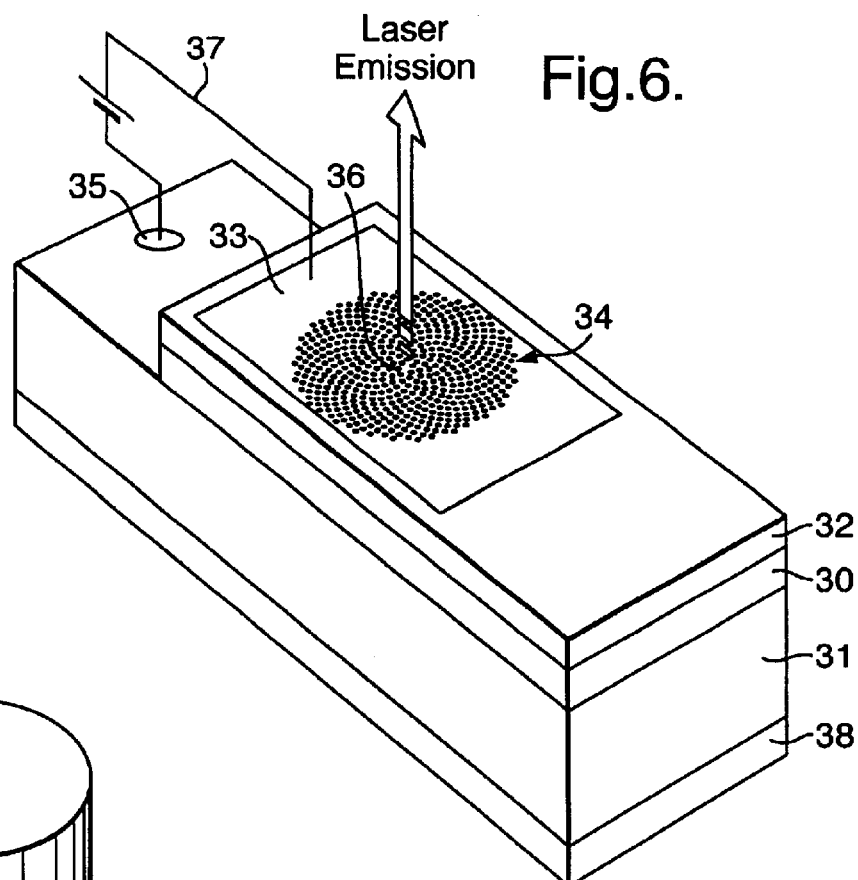
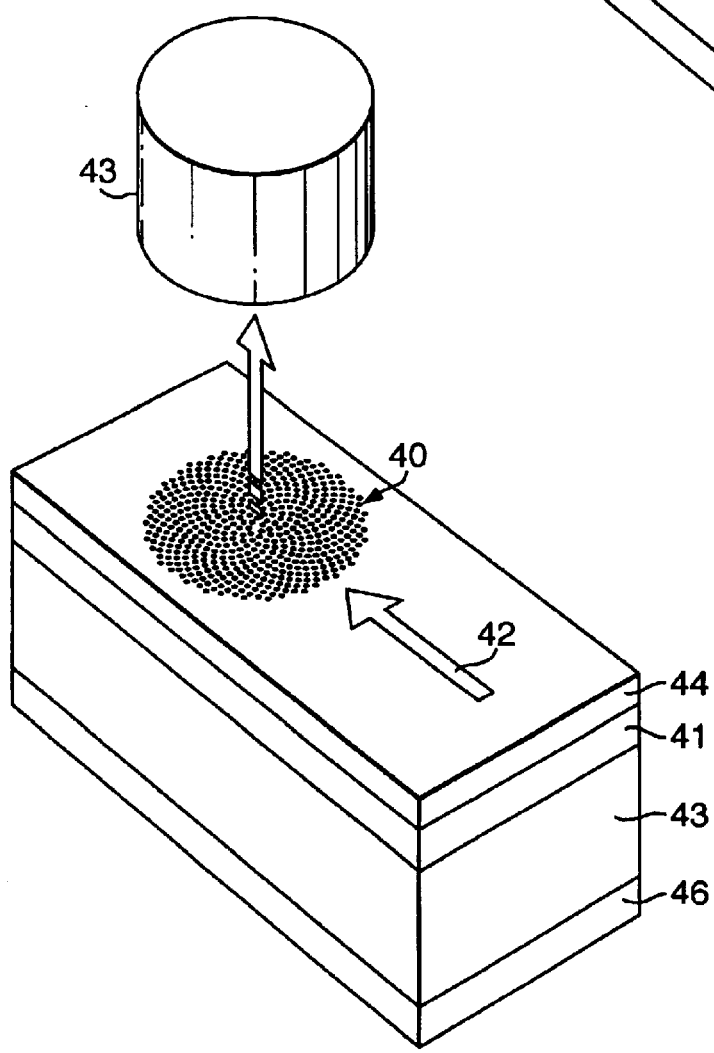

OPTICAL DEVICE

FIELD OF THE INVENTION

The present invention relates to waveguide structures including a region having a photonic band structure. Waveguide structures of this type can be used for a number of applications including lasers, filters, couplers and multiplexers.

BACKGROUND TO THE INVENTION

Planar waveguide structures including regions having a photonic band structure are known in the art and have been used for the construction of waveguides and integrated optical circuits. The photonic band structures can be provided by forming a lattice of holes in a dielectric substrate, the geometry of the lattice of holes and the properties of the dielectric material determining the photonic band structure. WO 98/53351 (BTG International Limited) describes planar photonic band structures of this type and describes methods of producing them. Similarly, photonic band structures can be formed by an array of rods surrounded by air or another medium.

Particular geometries for the lattice of holes are chosen to produce particular effects. WO 01/77726 (BTG International Limited) describes quasi periodic geometries for the lattice of holes which exhibit high orders of symmetry.

Photonic band structures can also be used in optical fibres. The fibre has a regular lattice of air cores running along its length and transmits a wide range of wavelengths without suffering from dispersion. It is made by packing a series of hollow glass capillary tubes around a solid glass core that runs through the centre. This structure is then heated and stretched to create a long fibre that is only a few microns in diameter.

SUMMARY OF THE INVENTION

According to the present invention, an optical device comprises a waveguide structure having a photonic band structure region, the photonic band structure region including a first region having a first refractive index and an array of sub-regions having a second refractive index, the array of sub-regions being arranged In a Fibonacci spiral patter.

A Fibonacci spiral pattern can be found in nature in the arrangement of the seeds of a sunflower, florets of a cauliflower, pine cones and even in the shell of a Nautilus. In the context of the present invention, a Fibonacci spiral pattern is an optimal packing system for the sub-regions surrounding a central region.

The diffraction patterns formed by the array of sub-regions within the photonic band structure region are circular Bragg rings and this provides highly isotropic behaviour about a central region. The fact that the band structure is identical in all directions minimises the tolerance in placing input and output waveguides or fibres. This isotropy provides several benefits such as relaxed fabrication tolerances. Similarly, mode divergence from the end of a waveguide or fibre is not critical using the optical device of the present invention. The band structure also possesses complete bandgaps for TE and TM polarisations even for relatively low dielectric contrasts. These two features make it extremely useful in laser design. When, the first region is made of a lasing material, the structure exhibits an isotropic bandgap inhibiting emission in a particular wavelength range. The bandgap may include the stronger emission lines of the lasing material and so the structure can be used to suppress these spectral wavelengths and enhance other weaker spectral wavelengths.

Preferably, in a Cartesian coordinate system, the Fibonacci spiral pattern is defined as $x_n = \cos(n\phi)\sqrt{n}$ and $y_n = \sin(n\phi)\sqrt{n}$ where $\phi = \pi(\sqrt{5}-1)$, and where n is the integer index for a point in the pattern. To generate the pattern a point is plotted for each value of n. Those values may be $n = 1, 2, 3, 4 \ldots$ etc. Alternatively, certain values of n may selectively omitted to create defects, ring patterns or zone plates. For example, odd values for n may be omitted leaving $n = 4, 6, 8, 10 \ldots$ etc.

In one implementation of the present invention, the optical device is a planar device including a substrate, a buffer layer, a core layer and a cladding layer, wherein the core layer is sandwiched between the buffer layer and the cladding layer.

Preferably, the array of sub-regions are holes formed In the first region. Preferably, the holes are formed through the cladding and core layers. Preferably, the holes are filled with a material having a third refractive index.

The optical device may be a laser device including an active core layer. The active material may be a doped dielectric material such as erbium doped tantalum pentoxide, silicon nitride, silicon oxynitride or a lasing material such as gallium arsenide or indium phosphide. Preferably, the array of holes are formed in a lasing cavity.

Preferably, the core is made from a lasing material and the photonic band structure region has a photonic bandgap covering at least one lasing wavelength of the core. The photonic band structure region may be optically pumped so as stimulate lasing. Accordingly, the device may further include an optical pump source coupled to the photonic band structure region for stimulating lasing. Alternatively, an electric current may be passed through the photonic band structure region or through the core region so as to stimulate lasing in which case the device may further include an electric current source coupled to the photonic band structure region for stimulating lasing.

The optical device may be a vertical cavity surface emitting laser (VCSEL), in which the photonic band structure prohibits lasing in the plane of the spiral pattern and so emits a laser beam from a central cavity of the Fibonacci spiral pattern, perpendicular to the spiral pattern.

Alternatively, the optical device could be a filtering device. In one embodiment, the filtering device includes an input waveguide for directing optical signals to the photonic band structure region and an output waveguide for receiving optical signals from the photonic band structure region. Preferably, the device includes a first output waveguide and a second output waveguide, wherein the photonic band structure region is positioned between the input waveguide and the second output waveguide such that in use light passing to the first output waveguide from the input waveguide does not pass through the photonic bandgap region and light passing to the second output waveguide does pass through the photonic bandgap region, and is thereby filtered. Alternatively, the device can be arranged to couple light to the first output waveguide through the photonic bandgap region while light reflected from the photonic bandgap region is coupled to the second output waveguide. The waveguides may be ridge or rib type waveguides. As an example, the device may be used as an optical add-drop multiplexer (OADM). The photonic band structure region may include a defect in the vicinity of an output waveguide, the defect giving rise to a local defect passband within a bandgap, thereby in use allowing light at the defect wavelength to enter the output waveguide from the photonic band structure region.

As a further alternative, the optical device could be an optical coupler adapted to couple light diffracted by the photonic band structure region out of the plane of the waveguide structure to another optical device, preferably an optical fibre, positioned out of the plane of the waveguide structure.

In another implementation of the present invention, the optical device is an optical fibre comprising a central core surrounded by a Fibonacci spiral pattern of sub-regions which extend along at least a portion of the length of the optical fibre. This structure again gives rise to an isotropic photonic bandgap covering the wavelengths of operation of the optical fibre, thus confining optical signals carried by the optical fibre to the core region of the optical fibre.

According to a second aspect of the present invention, a method of processing an optical signal comprises the step of coupling an optical signal into an optical device comprising a waveguide structure having a photonic band structure region, the photonic band structure region including a first region having a first refractive index and an array of sub-regions having a second refractive index, the array of sub-regions being arranged in a Fibonacci spiral pattern.

According to a third aspect of the present invention, a method of manufacturing an optical device, comprises the steps of forming a photonic band structure region in a waveguide structure, the photonic band structure region including a first region having a first refractive index and an array of sub-regions having a second refractive index, the array of sub-regions being arranged in a Fibonacci spiral pattern.

The method may be a method of manufacturing an optical fibre comprising the steps of stacking tubes or rods of silica glass or polymers or plastics in a Fibonacci spiral pattern to form a preform, fusing the tubes or rods together and drawing the preform down in size in a fibre pulling tower.

Preferably, the tubes or rods are placed in a template or holder to hold them in the Fibonacci spiral pattern. Alternatively, the tubes or rods may be of different diameters allowing them to pack in a Fibonacci spiral pattern. In another alternative, the tubes or rods may be trapezoidal columns with a hole formed through them longitudinally, which stack together to form a Fibonacci spiral pattern of holes.

The method may also be a method of manufacturing an optical fibre comprising the steps of drilling a Fibonacci spiral pattern of holes in a block and drawing the block into a fibre.

BRIEF DESCRIPTION OF THE DRAWINGS

Examples of the present invention will now be described in detail with reference to the accompanying drawings, in which:

FIG. 3b is a schematic illustration of the laser device of FIG. 3a;

FIG. 4b is a cross-section of FIG. 4a;

FIG. 5b is a schematic illustration of the VCSEL of FIG. 5a;

FIG. 6 shows a second example of a VCSEL design according to the present invention;

FIG. 7a shows a device for coupling light on and off a planar waveguide;

DETAILED DESCRIPTION

Figure 1:
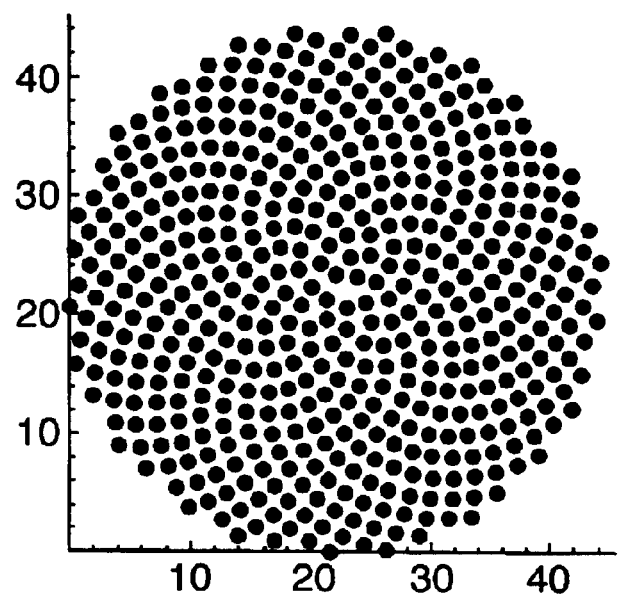
FIG. 1 shows a 2D Fibonacci series spiral pattern.

The pattern shown in FIG. 1 is generated by a Fibonacci series using a polar coordinate system. This pattern resembles patterns commonly found in nature, such as in pine kernels and sunflowers. Expressed in Cartesian coordinates the pattern may be generated by using the following equations:

$$x_n = \cos(n\phi)\sqrt{n}$$

$$y_n = \sin(n\phi)\sqrt{n}$$

where $\phi$ is the golden ratio $\phi=\pi(\sqrt{5}-1)$, and n is an integer. To generate the pattern a point is plotted for each value of n. The values used in FIG. 1 are n1, 2, 3, 4 . . . etc. Alternatively, certain values of n may selectively omitted to create defects, ring patterns or zone plates. For example, odd values for n may be omitted leaving n=4, 6, 8, 10 . . . etc. The size of the space or cavity at the centre of the pattern is determined by the lowest used value for n, the higher the lowest value for n, the larger the central cavity. This has important implications for the design of some types of laser devices as described below.

This 2D Fibonacci spiral pattern provides an optimal packing system for rods in a dielectric medium surrounding a central cavity region and as such the geometry provides an ideal method for the generation of cavities In photonic quasicrystals. The inherent introduction of the central cavity during the pattern generation can be exploited in the design of photonic crystal lasers. Due to the optimal packing of the rods around a central cavity region the laser device can be made more compact than conventional photonic crystal lasers while still maintaining an isotropic bandgap with strong extinction ratios and fewer rods.

Figure 2:
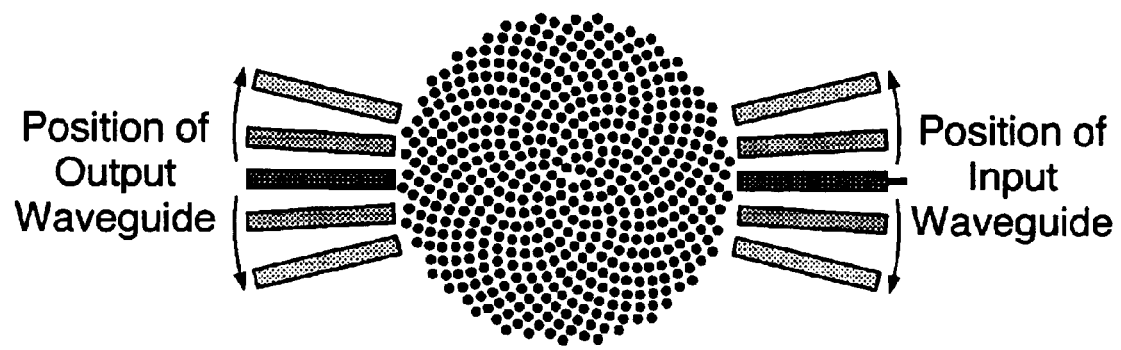
FIG. 2 illustrates the tolerances for coupling waveguides to a Fibonacci spiral pattern according to the present invention.

Importantly, the structure is highly isotropic around the central cavity region. This means that emission in all directions can be accurately predicted and controlled in all directions. It also has benefits in the coupling of light to and from the photonic band structure region. As shown in FIG. 2, the tolerance for placing input and output fibres accurately is reduced. In conventional photonic crystal devices the coupling of light into the correct mode is very important. This requires the coupling of light at an exact position and propagation direction. Additionally, the mode should be expanded out to form a plane wave to enhance the efficiency of coupling into the correct dispersion band. Owing to the isotropy of the bands in a quasicrystal based on a Fibonacci spiral pattern, the coupled mode shape and direction is not critical. The divergence of an input signal is therefore not a problem.

The structure also possesses complete bandgaps for TE and TM polarisations. These bandgaps may or may not overlap depending on the particular design of the stricture, ie the lattice pitch filling fraction, the waveguide geometrical and material properties, and the material properties of the rods. It is possible-to provide a complete and absolute bandgap.

Figure 3A:
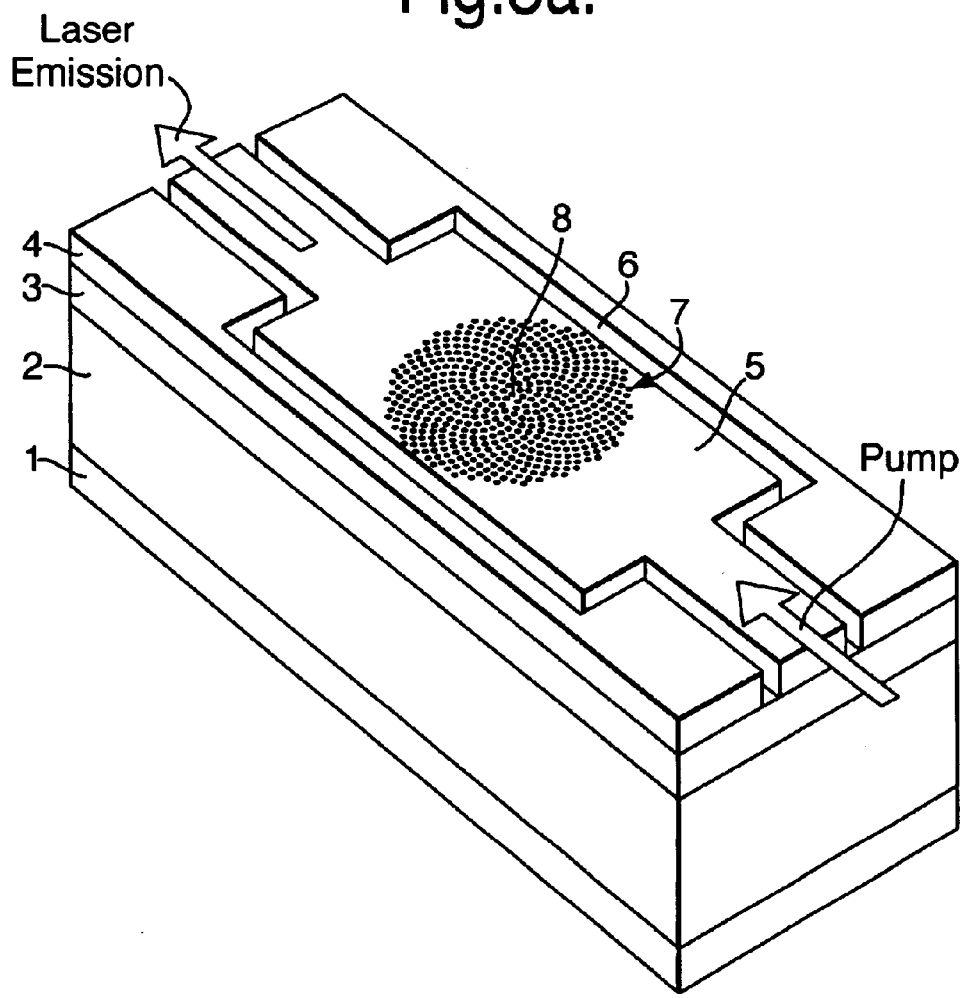
FIG. 3a shows a first example of a laser device according to the present invention.

FIG. 3 shows a particular application of the Fibonacci spiral pattern in a planar waveguide structure. FIG. 3a shows a laser design comprising a substrate 1 onto which a buffer layer 2 is formed. On top of the buffer layer 2 is a core layer 3 comprising an active lasing material. The core layer 3 is covered by a cladding layer 4. Both the buffer layer 2 and the cladding layer 4 are oxides. To satisfy the waveguiding condition, the buffer layer 2 and the cladding layer 4 are of a lower refractive Index than the core layer 3.

The structure incorporates a waveguide 5 formed between etched grooves 6 which extend through the cladding layer 4 and the core layer 3. Within the waveguide 5 the Fibonacci spiral pattern of holes 7 is formed around a central spot 8 to create a photonic band structure region. The holes extend through the cladding layer 4 and the core layer 3 and may extend wholly or partially Into the buffer layer 2. Alternatively, the holes may exist only In the core layer 3. Light passing through the core layer 3 will impinge upon the photonic band structure region 7. The Fibonacci spiral pattern of holes 7 in the core layer 3 gives rise to a photonic bandgap which will prevent certain wavelengths from propagating through it. The bandgap may be tuned by selecting the size and spacing of the holes or by filling the holes with a material of appropriate refractive index, to suppress certain stronger lasing wavelengths which will enhance some weaker lasing wavelengths lying outside the bandgap. The holes may even be filled with a material having a tunable refractive index, such as liquid crystal. Furthermore, the highly isotropic nature of the pattern is beneficial as the bandgap resides in the same wavelength, range for all directions of propagation, even for weak dielectric contrasts, providing good control of laser emission for all in-plane directions.

Figure 3B:
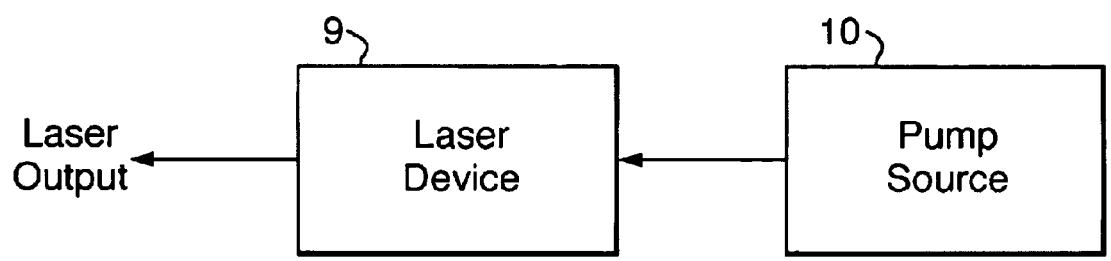

FIG. 3b is a schematic illustration of the laser 9 of FIG. 3a, including a pump signal source 10 used to stimulate lasing.

Figure 4A:
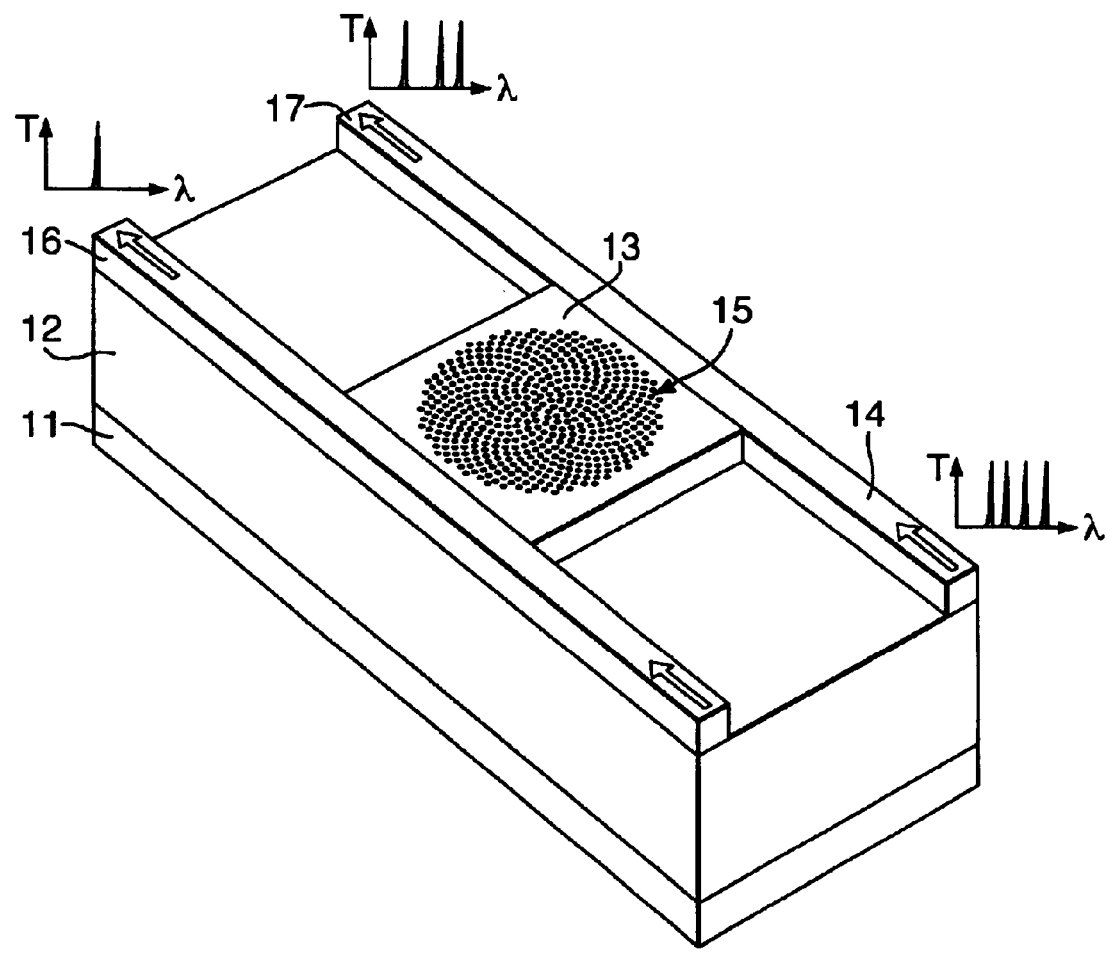
FIG. 4a shows a filtering device according to the present invention.
Figure 4B:
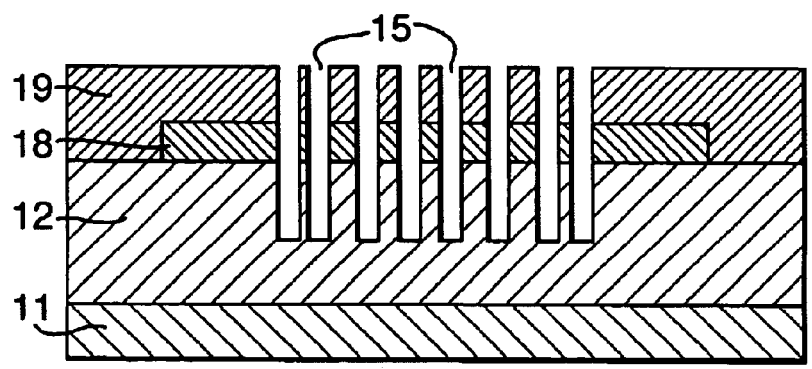

FIG. 4a shows another optical device, in this case a filter, incorporating the Fibonacci spiral pattern of holes that forms a photonic band structure region. FIG. 4b is a cross-section of FIG. 4a through the photonic band structure region. This structure includes a substrate layer 11 and a buffer layer 12 onto which a rib waveguide structure 13 is placed. The rib waveguide structure comprises a core layer 18 and a cladding layer 19 which are shown in FIG. 4b. For clarity the cladding layer is not shown in FIG. 4a. The rib waveguide structure 13 includes an input rib waveguide 14, a central region incorporating the Fibonacci spiral pattern 15 and output rib waveguides 16 and 17. The holes forming the Fibonacci spiral pattern extend through the cladding layer and the core layer and may extend wholly or partially into the buffer layer 12 as shown in FIG. 4b. Alternatively, the holes may exist only in the core layer. A WDM optical signal propagating along the input rib waveguide 14 reaches the photonic band structure region 15 where the light couples into whispering gallery modes. Whispering gallery modes are modes which are radially confined within the band structure region by total Internal reflection. As the Fibonacci spiral structure can only establish specific whispering gallery modes some of the input wavelengths are prevented from propagating through it. In this example, the relationship between the input signal and the Fibonacci spiral pattern is such that only a single wavelength from the input WDM optical signal may pass through it, which means that only a single wavelength of the signal is able to propagate to a first output waveguide 16. Those wavelengths prevented from propagating through the central region pass directly along the input rib waveguide 14 to a second output rib waveguide 17. The structure therefore acts as a drop filter. However, the same structure can also act as an optical add-drop multiplexer (OADM) by inputting and outputting optical signals from other waveguides.

Figure 5A:
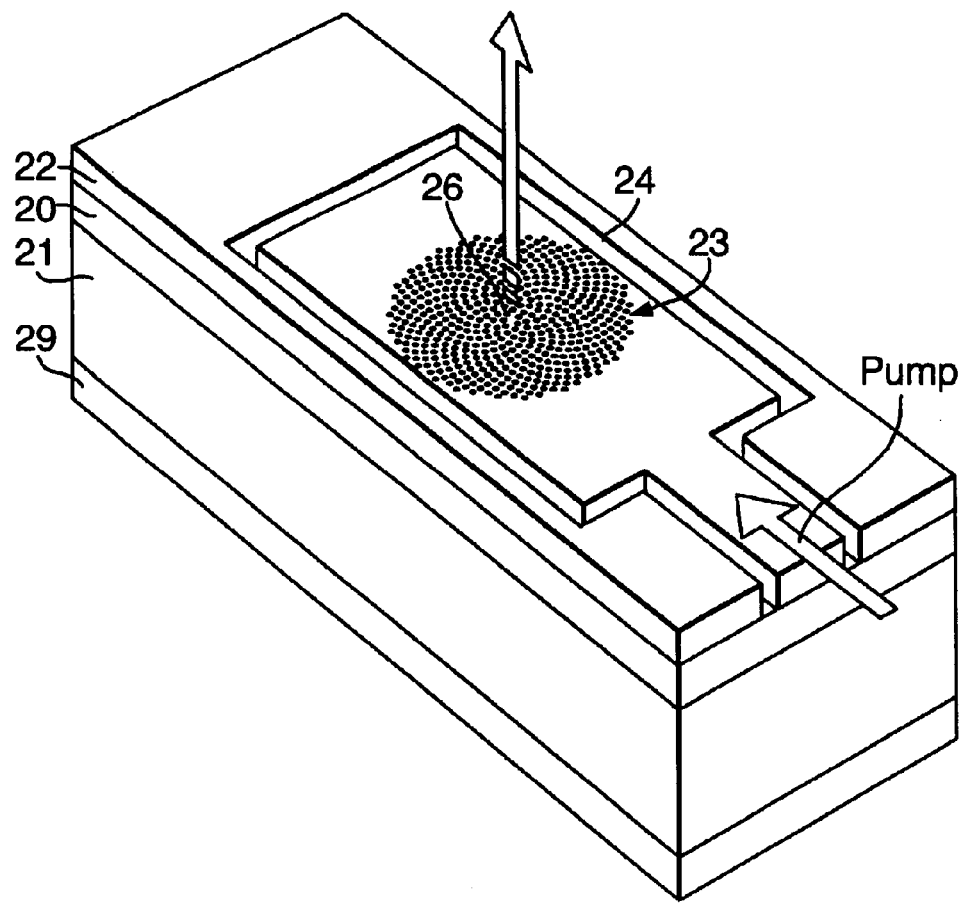
FIG. 5a shows a first example of a VCSEL design according to the present invention.

FIG. 5 shows an example of a vertical cavity surface emitting laser (VCSEL) design in accordance with the present invention. The structure shown in FIG. 5a includes a substrate layer 29, a buffer layer 21, a core layer 20 and a cladding layer 22. The core layer 20 is formed from an active material, such as a doped dielectric material such as erbium doped tantalum pentoxide, silicon nitride, silicon oxynitride or a lasing material such as gallium arsenide or indium phosphide, while the buffer 21 and cladding 22 layers are formed of a material (but not necessarily the same material) having a lower refractive index than the core layer 20, such as silicon dioxide. A photonic band structure region is formed by etching a pattern of holes in a Fibonacci spiral pattern 23. The holes extend through the cladding layer 22 and the core layer 20 and may extend wholly or partially into the buffer layer 21. Alternatively, the holes may exist only In the core layer 20. These holes can be filled with another material or the same material as the cladding. Grooves 24 are etched around the photonic bandgap region to confine light such that the structure inhibits lasing in the plane of the waveguide or enhances out of plane diffraction. The photonic band structure region 23 is optically pumped via an optical input 25 to stimulate laser emission. The spacing and geometry of the holes in the Fibonacci spiral pattern are chosen according to the lasing wavelengths of the active material forming the core layer, such that the bandgap formed by the holes inhibits lasing in the plane of the waveguide. This provides for laser emission perpendicular to the plane of the waveguide as shown. The laser light is emitted from a central cavity 26 of the Fibonacci spiral pattern of holes 23. The beam of emitted light can be accurately controlled and can be designed to provide minimal divergence with a spot size approximately equal to the size of the central cavity 26. The spot size can therefore be controlled by an appropriate starting value for n, the index of the sub region closest to the centre. The larger the lowest value of n, the larger the central cavity will be.

Figure 5B:
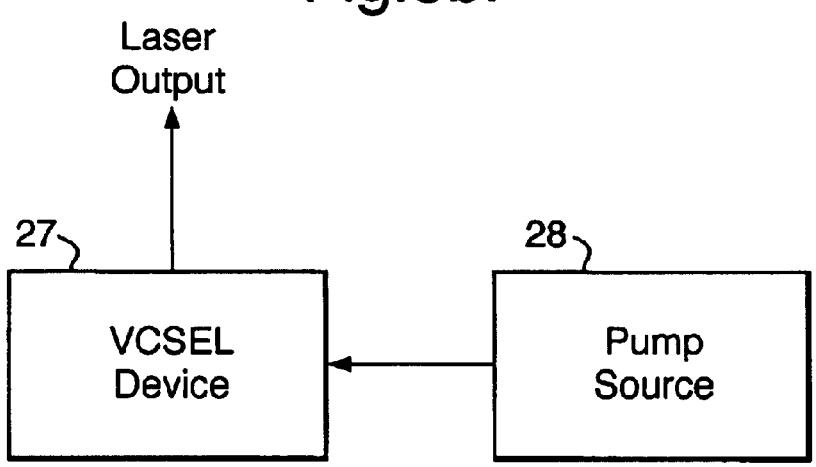

FIG. 5b is a schematic illustration of the VCSEL 27 of FIG. 5a, including a pump signal source 28 used to stimulate lasing in the VCSEL 27.

FIG. 6 shows another example of a VCSEL design. The basic structure is the same as shown in FIG. 5. The core layer 30 is composed of a multilayer of active materials such as n-doped AlGaAs, GaAs and p-doped AlGaAs (starting with the first to be deposited). The cladding layer 32 is composed of p++ doped AlGaAs and the buffer layer 31 of an n++ doped AlGaAs. Instead of optically pumping the photonic bandgap region, lasing is induced by applying an electric current (generated by a source 37) through the active multilayer core 30. Top metal contacts 33 are placed on top of the cladding layer 32 all around the photonic bandgap region 34 and another contact 35 placed beneath or on the buffer layer 31. The geometry of the holes is again chosen to inhibit lasing of the core 30 in the plane of the waveguide. Laser emission then occurs from a central spot 36 perpendicular to the plane of the waveguide. The electrical signal applied across the core can be modulated. This modulates the photonic band gap arising from the Fibonacci spiral pattern. By modulating the band gap between covering the lasing wavelength and not covering the lasing wavelength a modulated laser output is obtained.

FIG. 7 shows an optical coupling structure. The structure shown in FIG. 7a includes a substrate layer 46, a buffer layer 45, a core layer 41 and a cladding layer 44. The planar waveguide structure is as described above, with a Fibonacci spiral pattern of sub-regions 40 formed in the core layer 41 and in the cladding layer 44. Alternatively, the holes may exist only in the core layer. The spacing of the sub-regions 40 is such that It diffracts the impinging light from an input waveguide 42. Some of the light diffracts out of the plane of the waveguide. The diffraction pattern of the Fibonacci spiral pattern of sub-regions 40 forms sharp circular rings. Thus the diffracted light forms cone-like beams which can be collected by an optical fibre 43 positioned above the waveguide as shown. (In contrast, conventional photonic crystals have diffraction patterns formed of an array of dots which cannot be easily collected).

The collecting optical fibre 43 must be correctly aligned in order to collect the light efficiently. The angle through which the light is diffracted depends on a number of factors, primarily the geometry of the Fibonacci spiral pattern, but also the properties of the waveguide. If the light is strongly confined in the waveguide and the waveguide has a large effective refractive index the light will diverge strongly from the core and hence will diffract through a large angle. The angle of diffraction is also dependent on the wavelength of the light, which also determines the geometry of the Fibonacci spiral pattern. The diffraction pattern will also be different for different polarisation states as the light in the waveguide behaves differently for different polarisation states.

The efficiency of coupling of light out of the plane of the waveguide can be further improved by forming the interfaces between the sub-regions and the core at an angle to the perpendicular.

Figure 7B:
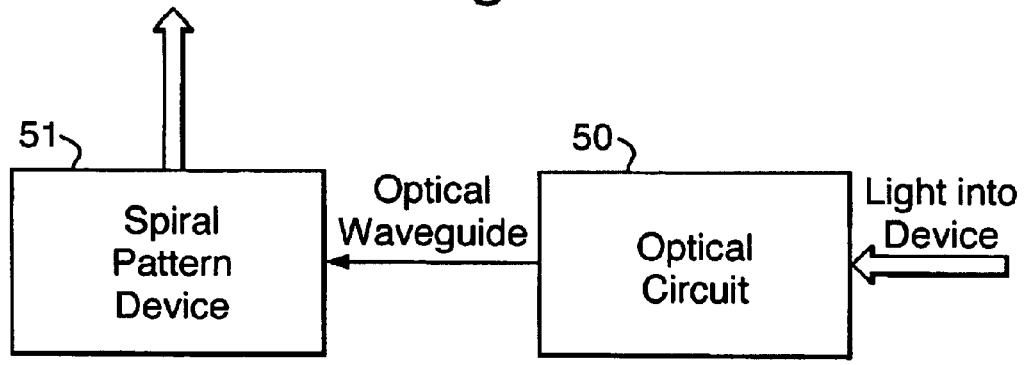
FIG. 7b is a schematic illustration of the device shown in FIG. 7 coupled to an integrated optical circuit.

FIG. 7b is a schematic representation of a device as shown in FIG. 7a connected to an optical circuit. An optical signal processed in a photonic integrated circuit 50 can be coupled into an optical fibre for transmission using a device 51 as shown in FIG. 7a without the need for butt-coupling. The size of the photonic band structure region can be matched to the diameter of the optical fibre to give optimal mode coupling.

Figure 8:
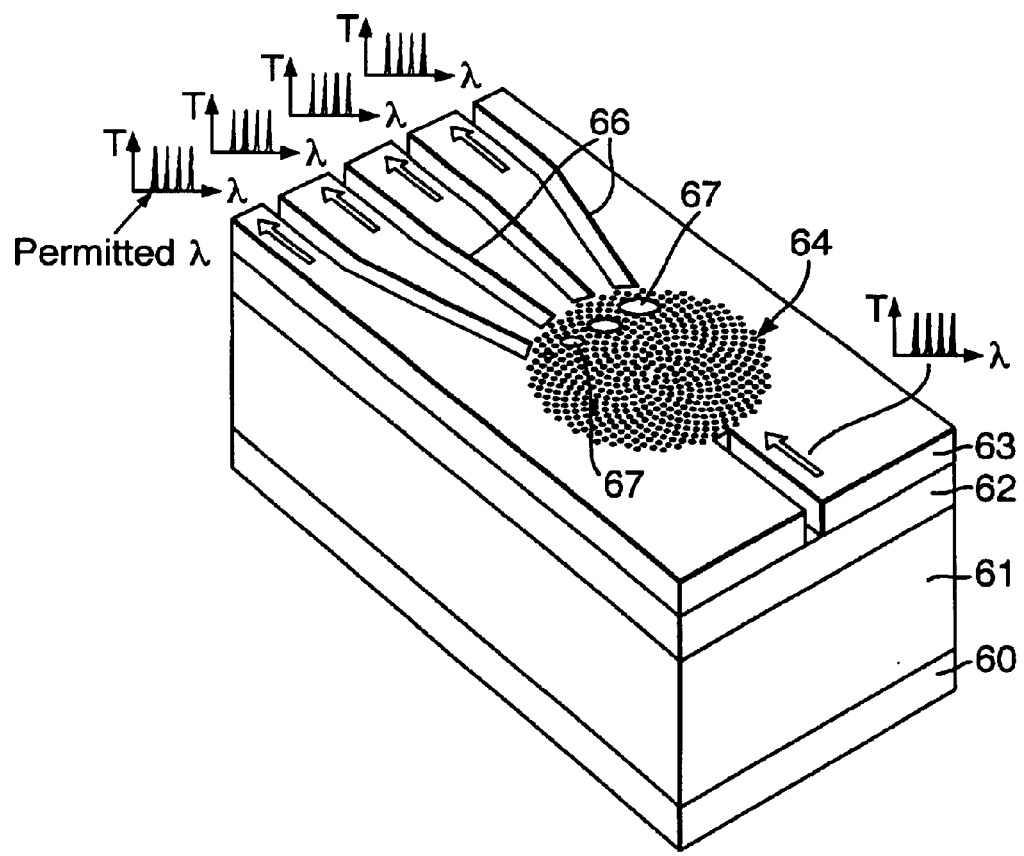
FIG. 8 is a first example of a multiplexer/demultiplexer in accordance with the present invention.

FIG. 8 shows an example of a demultiplexer device in accordance with the present Invention. The waveguide structure is a planar structure including a substrate layer 60, a buffer layer 61, a core layer 62 and a cladding layer 63. A Fibonacci spiral pattern of sub-regions 64 is formed in the core layer 62 and the cladding layer 63, to create a photonic band structure region. Alternatively, the holes may exist only in the core layer. An input waveguide 65, carrying a WDM signal is formed on one side of the photonic band structure region 64. The wavelengths of the multiplexed signal each lie within the bandgap. A plurality of output waveguides 66 are formed on the opposite side. On the output side of the Fibonacci pattern 64 a number of different defects 67 in the pattern are formed, each in proximity to a respective output waveguide 66. The defects 67 can be formed by variation in the hole size or slight shift in the position of the hole. Alternatively, a slight difference in the hole depth can also provide defect tuning. Defects can also be introduced by filling the holes with a material of different refractive index. This filler material can also be tunable, for example a liquid crystal, and hence the wavelength selection can be tuned still further. The defects 67 each introduce a defect passband at a different wavelength within the bandgap formed as a result the Fibonacci spiral pattern, the passband corresponding to the wavelengths is of the multiplexed signal. The output waveguides 66 therefore each receive that wavelength allowed to pass by the proximate defect and hence the whole device functions as a demultiplexer.

The device can be operated in reverse to form a multiplexer.

Figure 9:
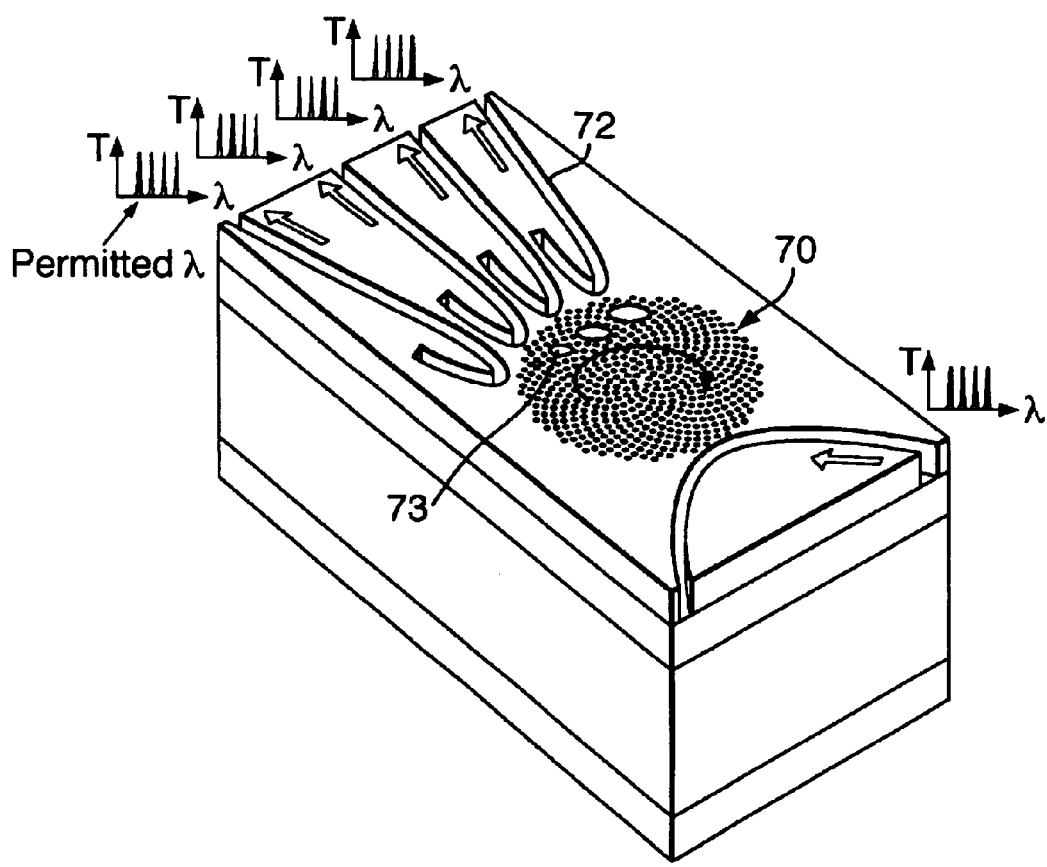
FIG. 9 is a second example of a multiplexer/demultiplexer in accordance with the present invention.

FIG. 9 shows a further demultiplexer design in accordance with the present invention. The device is very similar to the device shown in FIG. 8. Defects 73 are formed in the Fibonacci spiral pattern 70 in an identical fashion. However, the input 71 and output waveguides 72 are arranged tangential to the Fibonacci spiral pattern region 70 so that whispering gallery modes can couple into the Fibonacci spiral pattern from the input waveguide 71 and couple out into the output waveguides 72. The output wavelength for each waveguide is selected by the coupling from the Fibonacci spiral pattern whispering gallery mode to the defect and then the coupling from that to the specific output waveguide.

Figure 10:
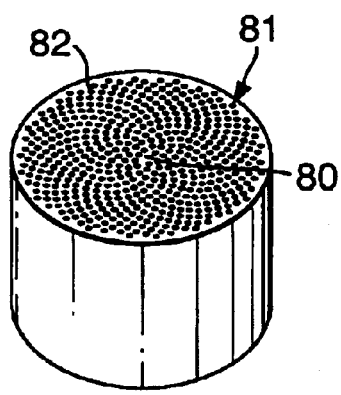
FIG. 10 is an example of a photonic optical fibre in accordance with the present invention.

FIG. 10 shows an optical fibre in accordance with the present invention. The fibre comprises a central core 80 surrounded by a Fibonacci spiral pattern of sub-regions 81 of a different refractive index. The Fibonacci spiral pattern gives rise to an isotropic photonic bandgap covering the wavelengths of operation of the fibre, thus confining optical signals to the core region. The fibre can be formed by stacking tubes or rods of silica glass (or polymers or plastics) in a Fibonacci spiral pattern to form a preform. This structure is then fused together and drawn down in size in a fibre pulling tower. This generates a photonic quasicrystal fibre.

Figure 11:
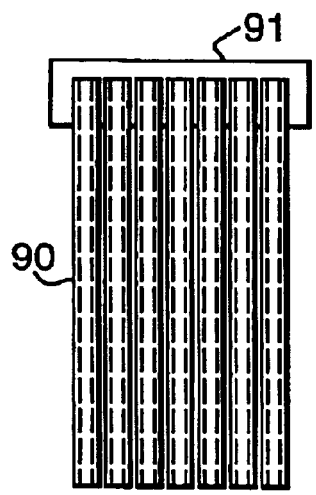
FIG. 11 shows a number of rods held in a template for forming an optical fibre in accordance with the present invention; and, FIG. 12 shows a number of trapezoidal block stacked together to form a is preform for an optical fibre in accordance with the present invention.

The rods 90 could be placed in a template or holder 91 to hold them in the Fibonacci spiral pattern during fusing and drawing, as shown in FIG. 11. This prevents a loss of alignment from occurring during fusing and drawing.

Figure 12:
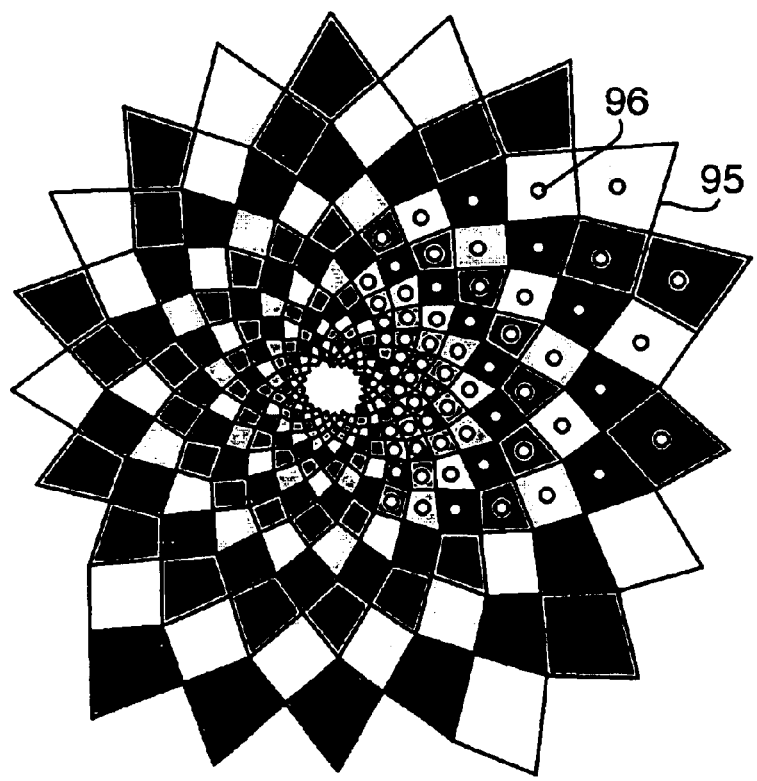

Alternatively, instead of circular rods, columns having a trapezoidal cross-section with a hole through each column as shown in FIG. 12 could be used. The columns 95 have different geometries that allow them to stack perfectly in a Fibonacci spiral pattern. In a further alternative, hollow rods of different diameters can be used, so that they stack perfectly in a Fibonacci spiral pattern. The smaller rods are placed in the centre with larger ones gradually added as they are packed in an outward fashion. The stack can then be placed in a tower and pulled.

In a still further alternative, a glass block can be drilled to form holes in the correct positions and the whole block can then be pulled to form a fibre.

What is claimed is:

1. An optical device comprising a waveguide structure having a photonic band structure region, the photonic band structure region including a first region having a first refractive index and an array of subregions having a second refractive index, the array of sub-regions being arranged in a Fibonacci spiral pattern.

2. An optical device according to claim 1, wherein in a Cartesian coordinate system, the Fibonacci spiral pattern is defined as $x_n=\cos(n\phi)\sqrt{n}$ $y_n=\sin(n\phi)\sqrt{n}$ where $\phi=\pi(\sqrt{5}-1)$, where n is the integer index for a point in the pattern.

3. An optical device according to claim 2, wherein the pattern is generated using consecutive values of n with the difference between consecutive values being 1.

4. An optical device according to claim 2, wherein the pattern is generated using consecutive values of n with the difference between at least one pair of consecutive values being greater than 1.

5. An optical device according to claim 2, wherein the subregions are holes formed in the first region.

6. An optical device according to claim 5, wherein the holes are filled with a material having a third refractive index.

7. An optical device according to claim 1, wherein the optical device is an optical coupler adapted to couple light diffracted by the photonic band structure region out of the plane of the waveguide structure.

8. An optical device according to claim 1, wherein the optical device is an optical fibre comprising a central core surrounded by a Fibonacci spiral pattern of sub-regions which extend along at least a portion of the length of the optical fibre.

9. An optical device according to claim 1, wherein, the optical device is a laser device Including an active core layer.

10. An optical device according to claim 9, wherein the active core layer is made from a doped dielectric material such as erbium doped tantalum pentoxide, silicon nitride, silicon oxynitride or a lasing material such as gallium arsenide or indium phosphide.

11. An optical device according to claim 9, wherein, the array of holes are formed in a lasing cavity.

12. An optical device according to claim 9, wherein the device is a vertical cavity surface emitting laser (VCSEL), in which the photonic band structure prohibits lasing in the plane of the spiral pattern and so in use emits a laser beam from a central cavity of the Fibonacci spiral pattern, perpendicular to the spiral pattern.

13. An optical device according to claim 1, wherein the optical device is a planar device including a substrate, a buffer layer, a core layer and a cladding layer, wherein the core layer is sandwiched between the buffer layer and the cladding layer.

14. An optical device according to claim 13, wherein the lattice of holes is formed through the cladding and core layers.

15. An optical device according to claim 13, wherein the core is made from a lasing material and the photonic band structure region has a photonic bandgap covering at least one lasing wavelength of the core.

16. An optical device according to claim 15, further comprising an optical pump source coupled to the photonic band structure region for stimulating lasing.

17. An optical device according to claim 15, further comprising an electric current source coupled to the photonic band structure region for stimulating lasing.

18. An optical device according to claim 1, wherein the device is a filtering device.

19. An optical device according to claim 18, wherein the waveguides are ridge or rib type waveguides.

20. An optical device according to claim 18, comprising a first output waveguide and a second output waveguide, wherein the device is arranged to couple light to the first output waveguide through the photonic bandgap region while light reflected from the photonic bandgap region is coupled to the second output waveguide.

21. An optical device according to claim 18, wherein the filtering device includes an input waveguide for directing optical signals to the photonic band structure region and an output waveguide for receiving optical signals from the photonic band structure region.

22. An optical device according to claim 21, wherein the device includes a first output waveguide and a second output waveguide, wherein the photonic band structure region is positioned between the input waveguide and the second output waveguide such that in use light passing to the first output waveguide from the input waveguide does not pass through the photonic bandgap region and light passing to the second output waveguide does pass through the photonic bandgap region, and is thereby filtered.

23. An optical device according to claim 21, wherein the photonic band structure region includes a defect in the vicinity of an output waveguide, the defect giving rise to a local defect passband within a bandgap, thereby in use allowing light at the defect wavelength to enter the output waveguide from the photonic band structure region.

24. A method of processing an optical signal comprising the step of coupling an optical signal into an optical device comprising a waveguide structure having a photonic band structure region, the photonic band structure region including a first region having a first refractive Index and an array of sub-regions having a second refractive index, the array of sub-regions being arranged in a Fibonacci spiral pattern.

25. A method of manufacturing an optical device, comprising the steps of forming a photonic band structure region in a waveguide structure, the photonic band structure region including a first region having a first refractive index and an array of sub-regions having a second refractive index, the array of sub-regions being arranged in a Fibonacci spiral pattern.

26. A method according to claim 25, wherein in a Cartesian coordinate system, the Fibonacci spiral pattern is defined as $x_n=\cos(n\phi)\sqrt{n}$ $y_n=\sin(n\phi)\sqrt{n}$ where $\phi=\pi(\sqrt{5}-1)$, where n is the integer index for a point in the pattern.

27. A method according to claim 25, wherein the first region is formed from a lasing material.

28. A method of manufacturing an optical fibre according to claim 25, comprising the steps of stacking tubes or rods of silica glass or polymers or plastics in a Fibonacci spiral pattern to form a preform, fusing the tubes or rods together and drawing the preform down in size in a fibre pulling tower.

29. A method of manufacturing an optical fibre according to claim 28, wherein the tubes or rods are placed in a template or holder to hold them in the Fibonacci spiral pattern.

30. A method of manufacturing an optical fibre according to claim 28, wherein the tubes or rods are of different diameters.

31. A method of manufacturing an optical fibre according to claim 28, wherein the tubes or rods are trapezoidal columns with a hole formed through them longitudinally, which stack together to form a Fibonacci spiral pattern of holes.

32. A method of manufacturing an optical fibre according to claim 25, comprising the steps of drilling a Fibonacci spiral pattern of holes in a block and drawing the block into a fibre.

* * * * *